US010281824B2

(12) United States Patent
Feldmann et al.

(10) Patent No.: US 10,281,824 B2
(45) Date of Patent: May 7, 2019

(54) MICROLITHOGRAPHY PROJECTION OBJECTIVE

(71) Applicant: Carl Zeiss SMT GmbH, Oberkochen (DE)

(72) Inventors: Heiko Feldmann, Aalen (DE); Daniel Kraehmer, Essingen (DE); Jean-Claude Perrin, Givry (FR); Julian Kaller, Koenigsbronn (DE); Aurelian Dodoc, Heidenheim (DE); Vladimir Kamenov, Essingen (DE); Olaf Conradi, Westhausen/Westerhofen (DE); Toralf Gruner, Aalen-Hofen (DE); Thomas Okon, Aalen (DE); Alexander Epple, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/414,005

(22) Filed: Jan. 24, 2017

(65) Prior Publication Data

US 2017/0192362 A1 Jul. 6, 2017

Related U.S. Application Data

(63) Continuation of application No. 11/916,162, filed as application No. PCT/EP2006/004876 on May 23, 2006, now abandoned.

(60) Provisional application No. 60/790,616, filed on Apr. 10, 2006, provisional application No. 60/686,784, filed on Jun. 2, 2005.

(51) Int. Cl.
*G03F 7/20* (2006.01)
*G02B 17/08* (2006.01)

(52) U.S. Cl.
CPC ......... *G03F 7/70225* (2013.01); *G02B 17/08* (2013.01); *G03F 7/702* (2013.01); *G03F 7/70283* (2013.01); *G03F 7/70941* (2013.01)

(58) Field of Classification Search
CPC .. G03F 7/70225; G03F 7/702; G03F 7/70283; G03F 7/70941; G03F 7/20; G02B 17/08; G02B 13/00; H01L 21/027
See application file for complete search history.

(56) References Cited

U.S. PATENT DOCUMENTS

| 3,606,535 A | 9/1971 | Koizumi |
| 4,776,683 A | 10/1988 | Maeda et al. |
| 5,323,208 A | 6/1994 | Fukuda et al. |

(Continued)

FOREIGN PATENT DOCUMENTS

| DE | 101 27 227 | 12/2002 |
| EP | 1191378 A1 | 3/2002 |

(Continued)

OTHER PUBLICATIONS

Korean Notice for Reasons for Rejection, with translation thereof, for corresponding Appl No. 10-2017-7020611, dated Nov. 6, 2017.

(Continued)

*Primary Examiner* — Deoram Persaud
(74) *Attorney, Agent, or Firm* — Fish & Richardson P.C.

(57) ABSTRACT

Microlithography projection objectives for imaging into an image plane a pattern arranged in an object plane are described with respect to suppressing false light in such projection objectives.

24 Claims, 11 Drawing Sheets

(56) References Cited

U.S. PATENT DOCUMENTS

| | | | |
|---|---|---|---|
| 5,963,377 A * | 10/1999 | Okada | G02B 15/177 359/663 |
| 6,172,825 B1 | 1/2001 | Takahashi | |
| 6,252,723 B1 * | 6/2001 | Nagaoka | G02B 15/173 359/652 |
| 6,324,359 B1 | 11/2001 | Nakane | |
| 6,717,746 B2 | 4/2004 | Epple et al. | |
| 6,731,374 B1 | 5/2004 | Sewell | |
| 9,097,984 B2 | 8/2015 | Feldmann et al. | |
| 2001/0040722 A1 | 11/2001 | Shafer et al. | |
| 2001/0043320 A1 | 11/2001 | Kato et al. | |
| 2001/0043391 A1 | 11/2001 | Shafer et al. | |
| 2002/0126400 A1 * | 9/2002 | Muller-Rissmann | G03F 7/70058 359/820 |
| 2002/0176063 A1 | 11/2002 | Omura | |
| 2002/0196533 A1 | 12/2002 | Shafer et al. | |
| 2003/0011755 A1 | 1/2003 | Omura et al. | |
| 2003/0020893 A1 | 1/2003 | Kawashima | |
| 2003/0021040 A1 | 1/2003 | Epple et al. | |
| 2004/0004771 A1 | 1/2004 | Omura | |
| 2004/0036971 A1 | 2/2004 | McGuire | |
| 2004/0130806 A1 | 7/2004 | Takahashi | |
| 2004/0150890 A1 | 8/2004 | Sato | |
| 2004/0160677 A1 | 8/2004 | Epple et al. | |
| 2004/0161677 A1 | 8/2004 | Nakao | |
| 2004/0174617 A1 | 9/2004 | Sewell | |
| 2004/0179178 A1 | 9/2004 | Emoto | |
| 2005/0036213 A1 | 2/2005 | Mann et al. | |
| 2005/0137084 A1 | 6/2005 | Krisko et al. | |
| 2005/0168807 A1 * | 8/2005 | Endo | G02B 15/173 359/354 |
| 2005/0190435 A1 | 9/2005 | Shafer et al. | |
| 2005/0195501 A1 | 9/2005 | Sato | |
| 2005/0207029 A1 | 9/2005 | Epple et al. | |
| 2005/0237512 A1 | 10/2005 | Smith et al. | |
| 2005/0248856 A1 | 11/2005 | Omura | |
| 2005/0264792 A1 | 12/2005 | Penn et al. | |
| 2006/0007559 A1 | 1/2006 | Sato | |
| 2006/0018041 A1 * | 1/2006 | Hirata | G02B 27/0018 359/738 |
| 2006/0023191 A1 | 2/2006 | Smirnov et al. | |
| 2006/0176461 A1 * | 8/2006 | Sekine | G03F 7/70341 355/67 |
| 2007/0002450 A1 * | 1/2007 | Watanabe | G02B 27/0025 359/601 |
| 2007/0070322 A1 | 3/2007 | Hudyma et al. | |
| 2007/0188879 A1 * | 8/2007 | Ikezawa | G03F 7/70341 359/649 |
| 2007/0297047 A1 * | 12/2007 | Yuuki | G02B 17/0892 359/364 |
| 2008/0259307 A1 * | 10/2008 | Arai | G03B 27/54 355/71 |
| 2009/0002674 A1 * | 1/2009 | Kawanami | G03B 27/72 355/71 |
| 2009/0080068 A1 | 3/2009 | Ozawa | |
| 2009/0115986 A1 | 5/2009 | Feldman et al. | |
| 2009/0213354 A1 | 8/2009 | Sandstrom et al. | |
| 2009/0296234 A1 * | 12/2009 | Asami | G02B 13/04 359/713 |
| 2009/0311636 A1 | 12/2009 | Minoda | |
| 2010/0227261 A1 * | 9/2010 | Shiraishi | G03F 1/14 430/5 |
| 2011/0285979 A1 * | 11/2011 | Dieckmann | G03F 7/70941 355/71 |
| 2014/0293256 A1 | 10/2014 | Feldman et al. | |
| 2014/0333913 A1 | 11/2014 | Feldman et al. | |

FOREIGN PATENT DOCUMENTS

| | | |
|---|---|---|
| EP | 1 202 291 | 5/2002 |
| EP | 1 662 325 | 5/2006 |
| JP | 57-2017 | 1/1982 |
| JP | 60-048015 | 3/1985 |
| JP | 60-053926 | 3/1985 |
| JP | 61-219018 | 9/1986 |
| JP | 06-196388 A | 7/1994 |
| JP | H06-235863 A | 8/1994 |
| JP | 11-111588 A | 4/1999 |
| JP | H11-111606 A | 4/1999 |
| JP | 2000-10005 | 1/2000 |
| JP | 2000-047114 A | 2/2000 |
| JP | 2000-242096 | 9/2000 |
| JP | 2002-082285 | 3/2002 |
| JP | 2002-107630 | 4/2002 |
| JP | 2002-118058 | 4/2002 |
| JP | 2002-184690 | 6/2002 |
| JP | 2003-017396 | 1/2003 |
| JP | 2003-043362 | 2/2003 |
| JP | 2003-045784 A | 2/2003 |
| JP | 2004-152833 | 5/2004 |
| JP | 2004-186689 | 7/2004 |
| JP | 2004-246343 | 9/2004 |
| JP | 2004-247527 A | 9/2004 |
| JP | 2005-039211 | 2/2005 |
| JP | 2005-039211 A | 2/2005 |
| JP | 2005-504337 | 2/2005 |
| JP | 2005-86148 | 3/2005 |
| JP | 2005-115127 A | 4/2005 |
| JP | 2005-533285 | 11/2005 |
| JP | 2006-203083 A | 8/2006 |
| KR | 2004-0048359 | 6/2004 |
| WO | WO 01/065296 A | 9/2001 |
| WO | WO 01/65296 A1 | 9/2001 |
| WO | WO 02/029869 A | 4/2002 |
| WO | WO 2002/029869 A | 4/2002 |
| WO | WO 2003/027747 | 4/2003 |
| WO | WO 2004/010164 | 1/2004 |
| WO | WO 2004/010164 A | 1/2004 |
| WO | WO 2004/019128 | 3/2004 |
| WO | WO 2004/021419 | 3/2004 |
| WO | WO 2004/107011 | 12/2004 |
| WO | WO 2005/069055 | 7/2005 |

OTHER PUBLICATIONS

International Preliminary Report on Patentability dated Dec. 6, 2007, for the corresponding PCT Application No. PCT/EP2006/004876, filed May 23, 2006.

International Search Report and a Written Opinion from a counterpart International Application No. PCT/EP2006/004876, dated Sep. 6, 2009.

Japanese Office Action, with English translation, for corresponding JP Appl No. 2008-513975, dated Feb. 15, 2012.

Japanese Office Action, with English translation, for corresponding JP Appl No. 2008-513975, dated Feb. 14, 2013.

Japanese Office Action, with translation thereof, for corresponding JP Appl No. 2012-139049, dated Oct. 25, 2013.

Japanese Office Action, with translation thereof, for corresponding JP Appl. No. 2008-513975, dated Mar. 11, 2014.

Korean Office Action, with translation thereof, for KR Appl No. 10-2007-7030861, dated May 29, 2014.

Korean Office Action, with translation thereof, for KR Appl No. 10-2014-7024428, dated Dec. 18, 2014.

Japanese Office Action, with translation thereof, for JP Appl No. 2014-092743, dated Feb. 24, 2015.

Japanese Office Action, with translation thereof, for JP Appln. No. 2014-146972, dated Jun. 30, 2015.

Korean Office Action, with English translation thereof, for KR Appl No. 10-2015-7016310, dated Oct. 12, 2015.

Japanese Office Action, with translation thereof, for JP Appln. No. 2014-146972, dated Jun. 9, 2016.

Korean Office Action, with English translation thereof, for KR Appl No. 10-2016-7023425, dated Oct. 13, 2016.

Korean Office Action, with translation thereof, for corresponding KR Appl No. 10-2018-7023085, dated Sep. 19, 2018.

Japanese Office Action, with translation thereof, for corresponding Appl No. 2017-100697, dated Jun. 25, 2018.

(56) References Cited

OTHER PUBLICATIONS

Japanese Examination Report, with translation thereof, for corresponding Appl No. 2017-151387, dated Aug. 27, 2018.

* cited by examiner

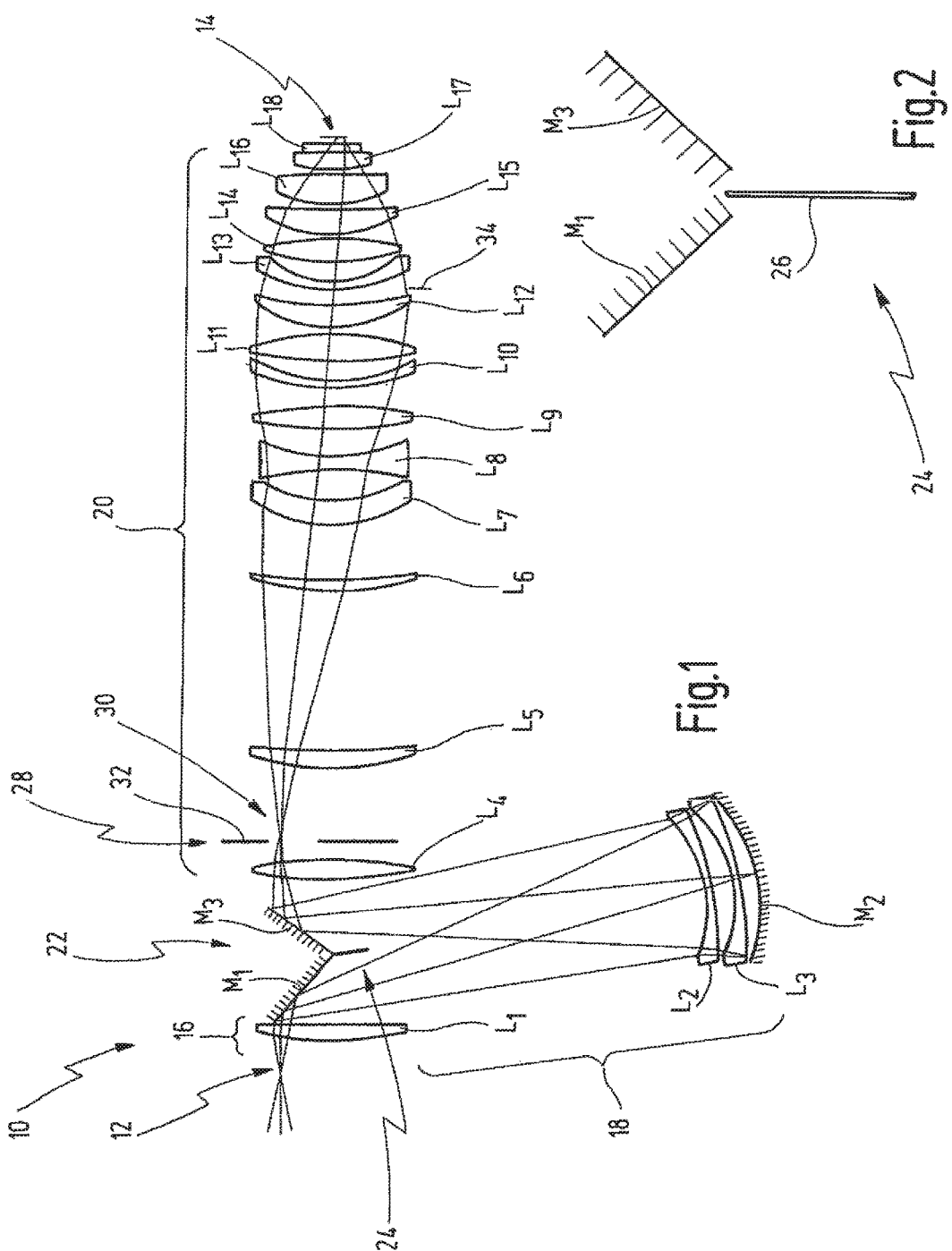

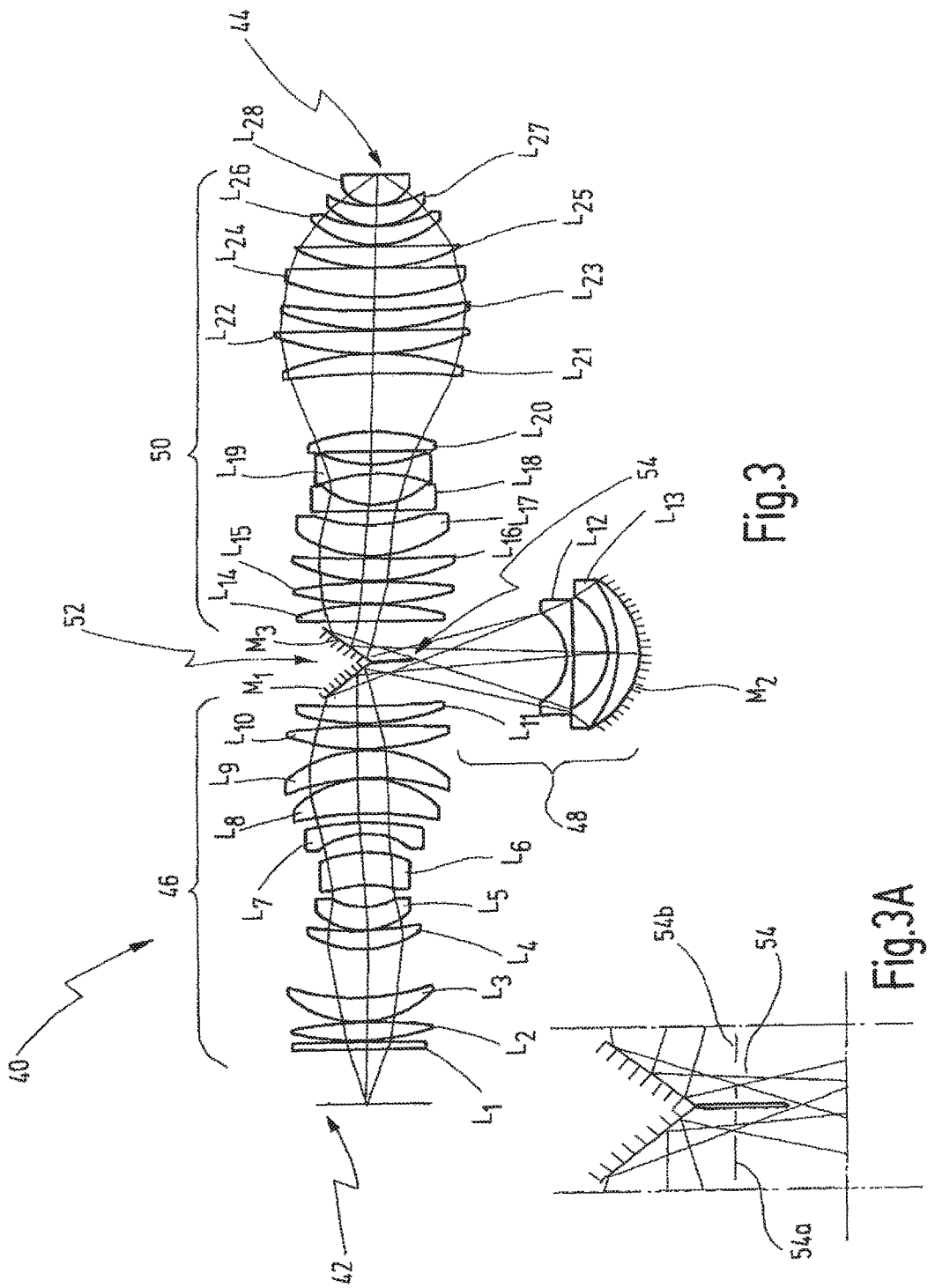

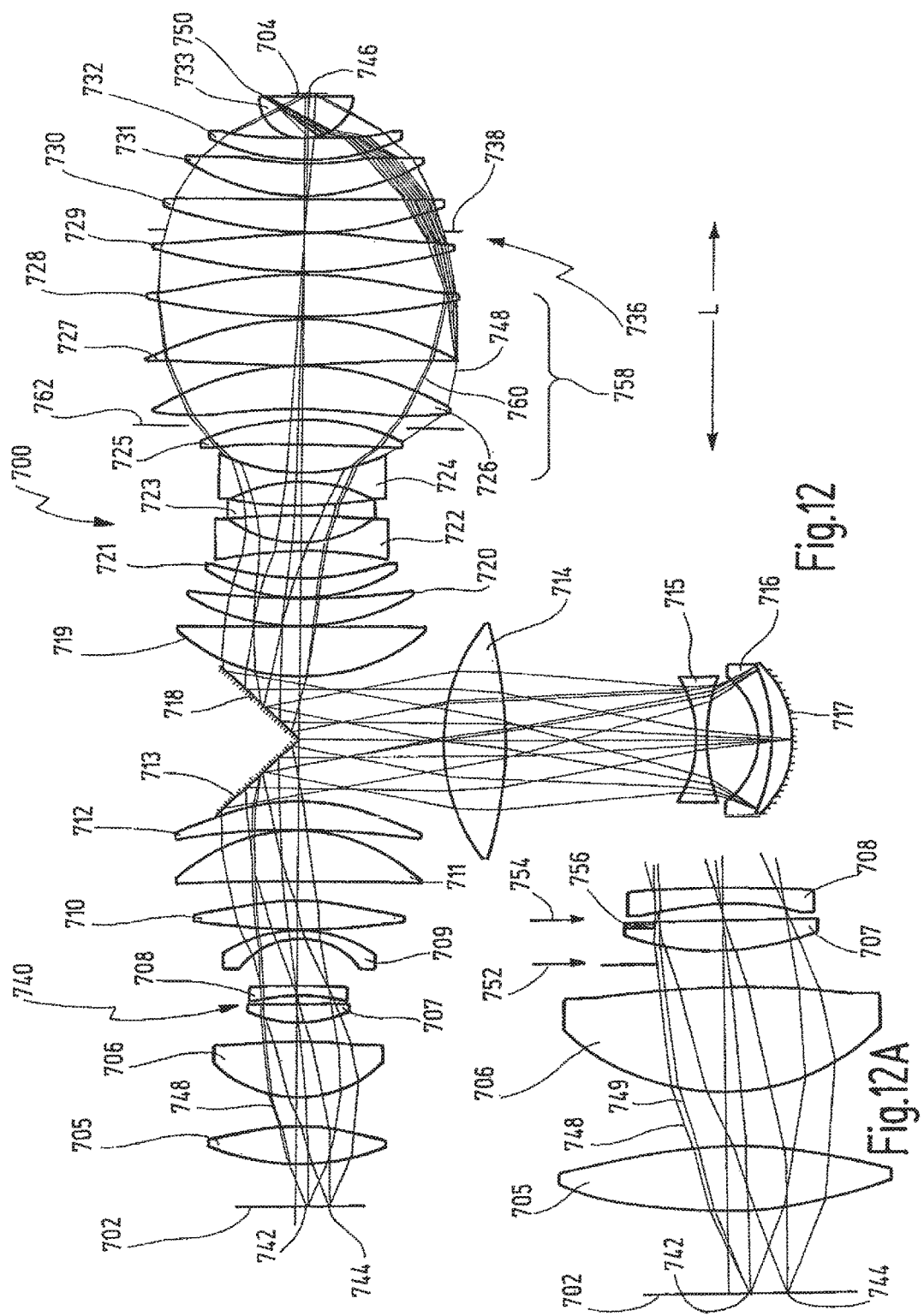

MICROLITHOGRAPHY PROJECTION OBJECTIVE

CROSS-REFERENCE TO RELATED APPLICATIONS

This application is a continuation of, and claims priority under 35 USC 120 to, U.S. application Ser. No. 11/916,162, filed May 16, 2008, now abandoned, which is a National Phase application under 35 U.S.C. § 371 filed from International Patent Application Serial No. PCT/EP2006/004876, filed on May 23, 2006, which claims priority to U.S. Provisional Application Ser. No. 60/790,616, filed Apr. 10, 2006, and Ser. No. 60/686,784, filed Jun. 2, 2005.

BACKGROUND OF THE INVENTION

The invention relates to a microlithography projection objective for imaging into an image plane a pattern arranged in an object plane.

The invention further relates to a projection exposure machine having such a projection objective.

The invention relates, furthermore, to a method for producing semiconductor components and other finely structured subassemblies.

Microlithography projection objectives are used in projection exposure machines for producing semiconductor components and other finely structured components, particularly in wafer scanners and wafer steppers. Such projection exposure machines serve the purpose of projecting patterns from photomasks or graticules, which are also generally designated as masks or reticles, onto an object (substrate) coated with a photosensitive layer with very high resolution. In this case, the mask is arranged in the object plane, and the substrate in the image plane of the projection objective.

Known among projection objectives are ones which exhibit a combination of refracting and reflecting optical elements, thus in particular a combination of lenses and mirrors. Such projection objectives are denoted as catadioptric.

An example of a catadioptric projection objective is disclosed in document DE 101 27 227 A1. A further example of a catadioptric projection objective is to be gathered from document WO 2004/019128 A2.

For example, the catadioptric projection objective disclosed in DE 101 27 227 A1 has, starting from the object plane, a first objective part and a second objective part adjacent thereto, and a third objective part adjacent thereto. Beam deflection takes place in the transition from the first objective part to the second objective part via a beam deflecting device that is formed there by a first folding mirror. The second objective part has a concave mirror which retroreflects the light again to the beam deflecting device, and the beam deflecting device, which has a further folding mirror in the transition from the second objective part into the third objective part, then directs the light into the third objective part. The two folding mirrors are at an angle of approximately 90° to one another. Moreover, in the case of this known projection objective the optical arrangement is made such that an intermediate image is produced in the third objective part.

Not only is it possible within the meaning of the present invention for a beam deflecting device to be formed by folding mirrors, but the beam deflecting the device can have, for example, a beam splitter cube or other optical elements suitable for beam deflection.

A problem that can arise in the case of projection objectives with beam deflection is that a portion of the light passing through the projection objective leaks at the beam deflecting device directly from the first objective part into the third objective part by omitting the second objective part. Such stray light or false light therefore does not traverse all the optical elements of the projection objective and is thus incapable of correctly imaging into the image plane of the projection objective the pattern arranged in the object plane of the projection objective, since the projection objective is designed such that only light that traverses all the optical elements in the prescribed sequence can contribute to proper imaging.

DE 101 27 227 A1 proposes arranging a stray light stop in the region of the intermediate image in order to reduce stray or false light. However, this does not effectively alleviate, still less eliminate, the problem of the partial direct light leakage from the first objective part into the third objective part.

As already mentioned above, microlithography projection exposure machines are designed as steppers or as scanners. In the case of steppers, a square or rectangular field is exposed on the stationary wafer. A round field would have the effect of being unable to make use of the complete wafer surface and is therefore not used in facilities for the mass production of semiconductors.

In the case of scanners, the pattern (reticle) and the wafer move, the field exposed on the wafer and the reticle being square or rectangular. Scanners are preferably used in the mass production of semiconductors.

Although rectangular field shapes are preferred for reasons of later process steps, in particular the division of the wafer into individual pieces, for reasons of production engineering projection objectives for use in steppers and scanners are generally constructed from round lens elements.

In the case of a rectangular field exposure, as well, false light occurs that makes no contribution to the imaging of the projected pattern. In addition to the above-described effect in the case of projection objectives having beam deflection, in the case of which false light leaks from one objective part into another objective part, while omitting specific objective parts, false light can also arise in general from reflections at individual lens surfaces and at the surfaces of the pattern (reticle) of the wafer, such reflections failing to vanish despite the use of antireflective layers on the lens surfaces. false light also arises through scattering at the surfaces and in the volume of the lenses.

Irrespective of the particular cause, false light disturbs the lithographic process as soon as it falls onto the wafer since the structures imaged by the exposure process widen owing to the false light background. In other words, false light that is propagating in the projection objective and reaches the image plane of the projection objective disturbs the contrast of the imaging of the pattern into the image plane.

As already described above, a projection objective operates properly in terms of function only when the imaging beam path that can be used for imaging traverses all the optically operative surfaces in a predetermined sequence. False images arise in a projection objective owing to false light that does not traverse all the optically operative surfaces of the projection objective, or that while actually traversing all the optically active surfaces of the projection objective does so in a sequence other than is required for proper imaging. In order for the false light to reach the wafer, an even number of additional reflections must take place. The additional reflections begin with the reflection at a lens surface that is designed as refracting. Hereafter, the light can be retroreflected at other lens surfaces or, in the case of catadioptric projection objectives, at mirrors.

The optical system that belongs to this novel beam path is designated as an "expanded" optical system. Such an "expanded" system images just like the actual projection objective. The false light that contributes to this imaging is certainly weak, since it arises chiefly from a reflection at a refracting surface that mostly also has a layer for reducing reflection.

The "expanded" optical system of the projection objective guides the false light in the direction of the wafer such that a false image is produced in the vicinity of the image plane of the projection objective.

In any event, false light in projection objectives worsens the imaging properties of the projection objective such that there is a need for projection objectives in which false light is suppressed as effectively as possible.

Still another problem in microlithography projection objectives arises in connection with the requirement to provide a uniform aperture over the entire used field. In projection objectives for microlithography, a vignetting, as it is known, for example, in objectives for photography, is undesired. In projection objectives known from prior art it is common to provide a single aperture stop in a pupil plane of the projection objective. However, there are optical designs in which a single aperture stop cannot guarantee the desired uniform aperture over the used field.

The reason for a non-uniform aperture over the field is that there are some rays which start from the object plane with an aperture which is larger than the design aperture of the projection objective and which are then aberrated so strongly that their actual pupil plane is spaced apart from the pupil plane which belongs to rays having apertures which are equal to or smaller than the design aperture. Accordingly, these so-called over-aperture rays are not necessarily mashed out by the system aperture stop, but can reach the image plane if the optical components have a sufficient extension in direction transverse to the propagation of light. These over-aperture rays are typically strongly aberrated and, when reaching the image plane, disturb the uniformity of the image field.

In addition or independent from the problems mentioned before, it can be an object in microlithography projection objectives to mask out light in the beam path of the projection objective such that the image plane remains completely unexposed. A motivation for doing so may be the measuring of the diffraction intensity distribution in order to obtain information for lense heating corrections. Further, during an interruption of the exposure process it is conceivable to supply the projection objective with an illumination which is complementary to the light used for imaging in order to produce a heating of the projection objective which is as uniform and rotationally symmetrical as possible, for example, if this is desired. In this case, too, it must be made sure that no light enters the image plane.

SUMMARY OF THE INVENTION

It is an object of the present invention to provide a microlithography projection objective of the type mentioned at the beginning whose imaging properties are improved by a more effective suppression of stray or false light.

It is a further object of the present invention to provide a projection exposure machine having such a projection objective, as well as a method for producing semiconductor components with the aid of such a projection objective.

In accordance with a first aspect of the invention, provision is made of a microlithography projection objective for imaging into an image plane a pattern arranged in an objective plane, comprising a first objective part, a second objective part and at least one third objective part, the second objective part defining a light propagation direction that differs from a light propagation direction in the first objective part and from a light propagation direction in the third objective part, and further comprising at least one beam deflecting device between the first and second objective parts and between the second and third objective parts, at least one shield being arranged in the region of the beam deflecting device in such a way that direct light leakage from the first objective part into the third objective part is at least reduced.

A direct light leakage from the first objective part into the third objective part while omitting the second objective part can be avoided by the provision of a shield in the region of the beam deflecting device. Reflections that leak directly past the beam deflecting device from the first objective part into the third objective part and could contribute to falsifying the imaging of the pattern into the image plane are rendered harmless by the shield. The fraction of stray or false light in the image plane is at least reduced by the provision of the at least one shield in the region of the beam deflecting device.

The shield should preferably be arranged and/or designed such that it does not limit the imaging beam path.

A shield such as is provided in the case of the projection objective according to the invention is to be distinguished from the system aperture stop or aperture stop usually provided for such a projection objective. A system aperture stop limits the imaging beam path, while the shield, be it designed as an aperture or as a shield plate without an opening, should, however, as far as possible not restrict or reduce the portion of the light used for imaging.

If, as in the case of the known projection objective, the beam deflecting device has a first reflecting surface and a second reflecting surface that are arranged at an angle to one another, the at least one shield extends in the direction of the second objective part starting from the angle vertex of the beam deflecting device, that is to say partially into the second objective part.

In this case, the shield is preferably a plate, preferably made from an absorbing material, for example from an absorbing metal. Alternatively, the absorption can also be achieved by an absorbing layer on the plate. Ideally, the absorption properties are tuned to the wavelength of the light used.

In addition to the shield, in the region of the beam deflecting device, whenever the projection objective produces at least one intermediate image in the second and/or third objective part it is preferred in addition to arrange at least one further stray light shield in the region of the intermediate image.

It is possible in this way to reduce further the fraction of stray light and false light that passes into the image plane and worsens the image of the pattern in the image plane.

A shield that is arranged in the region of an intermediate image is preferably a stray light stop that does not limit the imaging beam path.

It is preferred, furthermore, that the at least one stray light shield can be adjusted in position and/or is variable with regard to its active cross section.

It is advantageous in this case that reduction in stray light can be optimized for the respective projection objective by adjusting the position and/or setting of the active cross section of the at least one stray light shield, for example, by enlarging or reducing the shield, for example in the form of a plate, the optimization process being limited in that the imaging beam path is at least not substantially limited or restricted by the adjustment in position or the setting of the active cross section of the at least one stray light shield.

The adjustment in position and/or setting of the active cross section of the stray light shield is preferably performed as a function of the illumination mode (setting), of the aperture of the objective field size used.

As already mentioned above, the previously named stray light stop only has the function of reducing the level of stray or false light in the projection objective but not of limiting the lighting beam path.

The projection objective according to the invention is, in particular, a catadioptric projection objective in the case of which the second objective part is, for example, catadioptric and the third objective part is dioptric, the latter thus being constructed only from refracting optical elements.

In accordance with a further aspect of the invention, there is provided a microlithography projection objective for imaging into an image plane a pattern arranged in an object plane, comprising a plurality of optical components that respectively have at least one optically operative surface, in which there is present at least one first optical component of the plurality of optical components that has at least one first optically operative surface that, during the operation of the projection objective, has a first surface region not used by the imaging beam path for imaging the pattern into the image plane, the at least one first optically operative surface being assigned at least one first shield that masks out the first surface region, not used by the imaging beam path, of the first optically operative surface in order to suppress false light.

The basic idea of this aspect of the invention is that in the case, in particular, of those projection objectives that are used in projection exposure machines designed as steppers/scanners and in the case of which a square or rectangular field on the wafer is exposed, some of the optical components, which can be lenses or mirrors, are not used over their entire surface by the imaging beam path. In order to avoid here the propagation of false light in the projection objective, in the case of the projection objective according to the invention the unused surface regions of at least one, preferably a number of optical components, in particular lenses are masked out by at least one shield such that the false light cannot propagate through the surface regions of these optical components that are not used for the imaging beam path. It is possible thereby to achieve an effective suppression of false light.

It is preferred in this case when the at least one first shield is a plate or aperture stop arranged in the immediate vicinity of the at least one first optically operative surface, the aperture stop having an opening that is preferably adapted to the cross-sectional shape of the imaging beam path at the location of the aperture.

The presence of a plate or aperture stop with opening as shield has the advantage that a plate or aperture can be of movable design, as a result of which it is possible to optimize the suppression of false light by appropriately positioning the plate or aperture. In addition, the aperture stop may also be removed from the projection objective for full-field illumination with the aid of simple means.

The opening is preferably substantially rectangular in the case when the at least one shield is an aperture stop with opening.

The at least one shield in the form of the aperture stop is optimally adapted with the aid of this measure to a rectangular imaging beam path such as is present in steppers or scanners.

It is particularly preferred when the at least one first shield is a shielding coating on the first surface region of the at least one first optically operative surface of the optical component not used by the imaging beam path.

The advantage of this measure consists in that such a coating can already be provided when producing the optical component, it being possible to determine the useful surface region of the optical component in advance by calculation.

Irrespective of whether the at least one shield is provided in the form of a plate or aperture stop or in the form of a coating, it is preferred, furthermore, when the at least one first shield is reflective for a wavelength for the light used for imaging.

Alternatively, or in addition to a reflection of the false light, it is preferred, furthermore, when the at least one first shield is absorbing for a wavelength of the light used for imaging, or is provided with an absorbing coating.

The advantage of absorbing false light as against reflecting false light consists in an even more effective suppression of false light.

The absorbance of the shield is preferably at least approximately 95%, preferably at least approximately 98%.

In this way, false light is suppressed in a particularly effective way by absorption, and injurious flares are largely avoided.

It is preferred, furthermore, in the case of an absorbing shield when the at least one first shield has photocatalytic properties.

Via the photocatalytic properties, it is possible for the at least one shield, be it in the form of a plate or aperture stop or in the form of a coating on the surface of at least one optical component, to be used, furthermore, in an advantageous way to decompose adsorbed substances on the surface of the shield, or to support the decomposition. The photocatalytic decomposition of harmful substances such as, for example, hydrocarbons reduces the concentration of such substances in the gas space of the projection objective and substances such as could entail a reduction in transmission or reflection are thereby prevented from being precipitated onto the useful region of, for example, lenses or mirrors of the projection objective.

In a further preferred refinement, the at least one first optically operative surface that is assigned the at least one first shield is a near-field surface, in particular a surface that is located in the vicinity of an intermediate image of the imaging beam path or in the vicinity of the image plane or of the object plane.

By comparison with other optical components of the projection objective, optical components that are arranged in the vicinity of a field, in particular an intermediate image, have only a small optically used surface, while a large portion of the optical surface is not used for the imaging beam path. It is precisely such components that are therefore particularly suitable for suppressing false light, in particular when these components are assigned a shield in the form of a coating. In particular, shields can be provided between the object plane and the first lens and/or between the last lens and the image plane.

Optical components whose at least one optically active surface is assigned the at least one shield can be mirrors or else lenses.

Furthermore, as in the case of the projection objective in accordance with the first aspect of the invention, it is preferred when the at least one first shield can be adjusted in position and/or can be variably set with regard to its active cross section.

It is likewise preferred, in turn, when the setting of the at least one first shield can be performed in common with the setting of an aperture of the projection objective that limits the imaging beam path.

The setting of the at least one first shield will preferably be a unction in this case of the size of the image field used for imaging, as is the case, in particular, with a projection objective for use in a stepper or scanner.

The setting of the at least one first shield is preferably performed as a function of the illumination setting.

The illumination setting is understood as the size of the field used, and the angular distribution of the light used for illuminating the reticle (pattern).

The second aspect of the present invention can advantageously be used, in particular, with those projection objectives that produce one or more intermediate images between the reticle and the wafer, as is the case with catadioptric projection objectives.

In such a case, the plurality of optical components have at least one further optical component that has at least one further optically operative surface that, during operation of the projection objective, has a further surface region not used by the imaging beam path for imaging the pattern into the image plane, the at least one further optically operative surface being assigned at least one further shield that masks out the further surface region, not used by the imaging beam path, of the further optically operative surface.

The more optical components whose optically operative surface is only used in part by the imaging beam path for imaging the reticle onto the wafer that are assigned a shield, in particular in the form of a coating, the more effectively false light can be suppressed, the imaging properties of the projection objective thereby being further improved.

The second aspect of the invention can advantageously be used, in particular in the case of projection objectives whose plurality of optical components have at least two mirrors or at least four mirrors.

Furthermore, the invention can be used not only in the case of so-called dry objectives, but also with immersion objectives in which there is present between the wafer and the terminating element of the projection objective an immersion liquid for reducing the effective wavelength of the light and for increasing the numerical aperture.

In accordance with a yet further aspect of the invention, there is provided a microlithography projection objective for imaging into an image plane a pattern arranged in an object plane, comprising a plurality of optical components that includes at least one mirror, wherein an imaging beam path that can be used for imaging the pattern into the image plane has in the region of the at least first mirror beam path segments that run obliquely relative to one another and overlap one another at least partially in an overlap region and are spaced apart from one another outside the overlap region by a gap, at least one shield for suppressing false light being arranged in the gap.

The basic idea of this aspect of the invention is that in the case of a catadioptric projection objective having at least one mirror, there are beam path segments of the imaging beam path that overlap at least partially owing to the reflection at the at least one mirror, but which run separately outside the overlap region and then leave free between themselves an admittedly narrow gap.

Such beam path segments are encountered, in particular, in catadioptric projection objectives having optical elements through which the beam path passes repeatedly.

In accordance with the third aspect of the invention, a shield is now introduced precisely into this gap in order to suppress propagation of false light. The shield for suppressing false light thereby fills up the interspace between the two beams or beam path segments. The shield does not in this case interfere with the proper imaging beam path, but prevents false light from propagating beyond the gap.

The third aspect of the invention can be used particularly effectively in the case of a projection objective whose plurality of optical components includes at least one first and at least one second mirror, one of the beam path segments being a beam path segment reflected by the second mirror, and another one of the beam path segments being a beam path segment reflected by the first mirror, the at least one shield being arranged between the first mirror and the at least one second mirror.

It is advantageous in this case that the shield arranged between the two mirrors can act on both sides, specifically by virtue of the fact that the beams that propagate toward the second mirror are blocked on the image side of the shield, while the light beams that pass by the shield are blocked by the object side of the shield after reflection at the second mirror.

A blocking effect can also be achieved by a number of sequentially introduced shields in the space between the two mirrors.

It is preferably possible to provide a plate or aperture with an opening as the at least one shield, the at least one shield preferably being fastened on the first or second mirror.

The third aspect of the invention can, however, advantageously be used not only with projection objectives having two mirrors, but also with other catadioptric projection objectives having more than two mirrors.

In accordance with a fourth aspect of the invention, a microlithography projection objective for imaging into an image plane a pattern arranged in an object plane is provided, comprising a plurality of optical components, and a first pupil plane and at least a second pupil plane, a first aperture stop defining the system aperture being arranged at least near the first pupil plane, and further comprising at least a second aperture stop.

According to this aspect of the invention, the microlithography projection objective according to the invention is provided with at least two aperture stops, one defining the system aperture which is already present in known projection objectives, and the at least one further aperture stop can be particularly useful for shielding over-aperture light coming from the object plane so that this over-aperture light is hindered to reach the image plane. The at least one second aperture stop is preferably arranged in a position in the projection objective where the over-aperture rays are separated from the rays which are used for imaging.

Preferably, the at least one second aperture stop is arranged near the first or second pupil plane or in the second pupil plane of the projection objective, in particular if the over-aperture light is separated in this second pupil plane from the rays used for imaging.

If the at least second aperture stop is used for masking out over-aperture light, it is preferably arranged in a position where the separation of the over-aperture rays from the rays used for imaging is maximum.

The at least one second aperture stop is preferably arranged in a distance L from a pupil plane, wherein L is chosen such that $0.5D<L<2D$, wherein D is a diameter of an optical component of the plurality of optical components which have the maximum diameter of the optical components.

In a further preferred embodiment, the at least one second aperture stop is formed by a non-transmissive coating on an optical component of the plurality of optical components.

This measure is advantageous in case that there is not sufficient space for introducing a plate as the aperture stop. A non-transmissive coating can be formed by e.g. blacking a part of the surface of the respective optical component.

The at least one second aperture stop cannot only be used for masking out over-aperture rays, but also for shutting off the beam path in co-acting with the system aperture stop.

The provision of at least a second aperture stop in the projection objective is in particular advantageous in case the projection objective has at least one optical component having an aspherical optically operative surface.

The provision of at least one second aperture stop is also advantageous in case the projection objective has at least two pupil planes separated by an intermediate image plane.

A further advantage of the provision of at least a second aperture stop is that requirements on the mechanical tolerances of the maximum aperture provided by the adjustable system aperture stop can be lowered, because the at least one second aperture stop can take over the function of the system aperture stop for the maximum apertures.

In accordance with a yet further aspect of the invention, a microlithography projection exposure machine has a projection objective of the previously mentioned types.

In accordance with a yet further aspect of the invention, a method is provided for producing semiconductor components and other finely structured components, wherein a mask with a prescribed pattern is provided, the mask is illuminated with ultraviolet light of a prescribed wavelength, and the pattern is imaged onto a photosensitive substrate arranged in the region of an image plane of the projection objective.

Further advantages and features emerge from the following description.

It is self-evident that the abovementioned features which are still to be explained below can be used not only in the combination respectively specified, but also in other combinations or on their own without departing from the scope of the present invention.

BRIEF DESCRIPTION OF THE DRAWINGS

Exemplary embodiments of the invention are illustrated in the drawings and explained in more detail hereafter with reference thereto. In the drawings:

FIG. 1 shows a first exemplary embodiment of a projection objective in side view;

FIG. 2 shows an enlarged section of the projection objective in FIG. 1 in the region of the beam deflecting device of the projection objective;

FIG. 3 shows a further exemplary embodiment of a projection objective in side view;

FIG. 3A shows a section of the projection objective in FIG. 3 on an enlarged scale;

FIG. 12A shows a yet further exemplary embodiment of a projection objective according to another aspect of the invention.

DETAILED DESCRIPTION OF PREFERRED EXEMPLARY EMBODIMENTS

Figure 4:
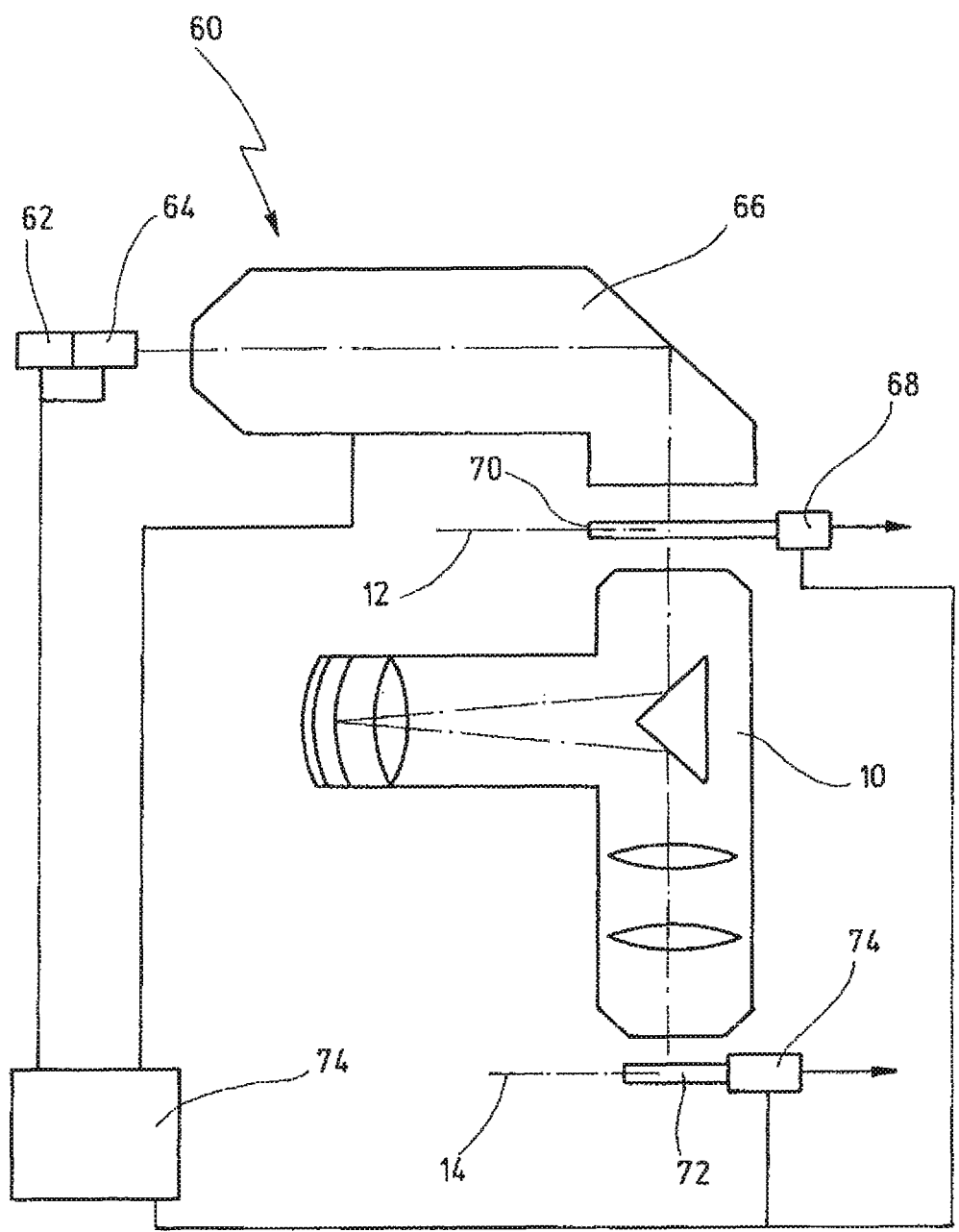
FIG. 4 shows a projection exposure machine comprising the projection objective in FIG. 1 in a schematic illustration.

FIG. 1 shows a microlithography projection objective provided with the general reference numeral 10 intended for imaging into an image plane 14 a pattern (not shown) arranged in an object plane 12.

The projection objective 10 has a first objective part 16, a second objective part 18 and a third objective part 20.

The first objective part 16 is dioptric and is formed by a lens $L_1$.

The second objective part 18 is catadioptric and has lenses $L_2$, $L_3$ and a concave mirror $M_2$.

The third objective part 20 is dioptric and has lenses $L_4$ to $L_{17}$ and an end plate $L_{18}$.

As shown in FIG. 1, the light propagation direction in the second objective part 18 differs from the light propagation direction in the first objective part 12 and in the third objective part 20. To this end, the projection objective 10 has a beam deflecting device 22, that is formed in the exemplary embodiment shown by two folding mirrors $M_1$ and $M_3$. The folding mirror $M_1$ deflects the light beam coming from the first objective part 16 into the second objective part 18 toward the mirror $M_2$, and the second folding mirror $M_3$ deflects the light beam coming from the second objective part 18 into the third objective part 20.

The light propagation direction in the third objective part 20 corresponds to that in the first objective part 16.

A shield 24 that is non-transmissive to light is provided in the region of the beam deflecting device 22 in order to avoid a direct light leakage froth the first objective part 16 into the third objective part 20, for example reflections from the surfaces of the lens $L_1$. In particular, the shield 24 prevents light leaking from the first objective part 16 into the third objective part 20 with the omission of the second objective part 18, that is to say prevents it from not going through the lenses $L_2$, $L_3$ and being reflected at the mirror $M_2$.

As already mentioned, the beam deflecting device 22 is formed by the two folding mirrors $M_1$ and $M_3$, whose reflecting surfaces are arranged at an angle to one another, as is illustrated in FIGS. 1 and 2. The two reflecting surfaces, that is to say the mirrors $M_1$ and $M_3$ are arranged in accordance with the beam deflection to be effected at an angle (here approximately 90°) to one another, the shield 24 extending, starting from the angle vertex of the two mirrors $M_1$ and $M_3$ in the direction of the second objective part 18.

The shield 24 is a plate 26, for example, a metal plate, that absorbs in the wavelength region of the light used. In addition, this plate can be provided with an absorbing layer. Instead of a metal plate, however, it is also possible to use an element made from another material that may be coated so as to be absorbing. In accordance with FIG. 2, the two mirrors $M_1$ and $M_3$ are slightly apart from one another at the angle vertex such that the plate 26 can be positioned there and does not mask out the useful light.

The shield 24 is designed and arranged such that it does not limit or restrict the imaging beam path, that is to say the beam path of the light that is to be used for imaging. The positioning and extent of the plate 26 in the direction of the light propagation into the second objective part 18 are to be designed correspondingly.

A further shield 28 is arranged in the region of an intermediate image 30, which is produced in the third objective part 20, in order to further reduce the level of stray light in the projection objective 10.

The shield 28 comprises a stray light stop 32 that reduces the passage of stray light. The stray light stop 32 is, however, to be distinguished from a system aperture stop 34 that serves to limit the imaging beam path. The stray light stop 32, by contrast, does not limit the imaging beam path, but serves to reduce stray light fractions in the projection objective 10.

It is preferably provided that the shield 24 and/or the shield 28 can be adjusted in position, and/or can be variably set with regard to its active cross section. For example, the plate 26 of the shield 24 could be movable and of variable length such that the optimum position and the optimum active cross section of the plate 26 can be set in order to reduce stray light. Adjusting the position and/or setting of the active cross section of the stray light shield is preferably performed as a function of the illumination mode (setting), of the aperture of the objective and/or of the object field size that is used.

It could be provided, for example, in the case of the stray light stop 32 to vary the opening cross section of the stray light stop 32 and/or to configure the stray light stop 32 such that it can be adjusted in position so that the stray light stop 32 can be brought into the optimum position.

It is self-evident that further shields can be provided in the projection objective 10 in order to reduce the level of stray light in the projection objective 10.

It has emerged that a stray light reduction of approximately 30% and more is within the range of the possible with the aid of suitably mounted shields.

FIG. 3 illustrates a further microlithography projection objective 40 for imaging a pattern (not illustrated) arranged in an object plane 42 in an image plane 44.

The projection objective 40 is disclosed in document WO 2004/019128 A2, to which reference may be made for a more accurate description of the design.

Like the projection objective 10 the projection objective 40 is a catadioptric projection objective, the projection objective 40 having a first objective part 46 with a plate $L_1$ and lenses $L_2$ to $L_{11}$, a second objective part 48 with lenses $L_{12}$, $L_{13}$ and a mirror $M_2$ and a third objective part 50 with lenses $L_{14}$, to $L_{28}$.

A beam deflecting device 52 that, as in the case of the exemplary embodiment in FIG. 1, comprises a folding mirror $M_1$ and a folding mirror $M_3$ is arranged between the first objective part 46 and the second objective part 48 or the second objective part 48 and the third objective part 50.

In the case of the projection objective 40, as well, there is provided in the region of the deflecting device 52 a shield 54, comparable to the shield 24 of the projection objective 10, which has the effect of preventing stray light leaking from the first objective part 46 into the third objective part 50.

An enlarged section of the projection objective 40 in the region of the beam deflecting device 52 is illustrated in FIG. 3A. In addition to the shield 54, in the case of the projection objective 40 there are provided a further shield 54a and a further shield 54b that are respectively arranged in the region of an intermediate image of the projection objective 40. The shields 54a and 54b are designed as stray light stops.

For the rest, reference may be made to the description of the shield 24 in FIG. 1 with regard to the configuration of the shield 54, that is to say the configuration of the shield 54 corresponds to that of the shield 24.

The general reference 60 in FIG. 4 indicates a projection exposure machine in which, for example, the projection objective 10 is used. The projection exposure machine comprises a laser light source 62 with a device 64 for narrowing the bandwidth of the laser. An illumination system 66 produces a large, sharply delimited and very homogenously illuminated image field that is adapted to the telecentric requirements of the downstream projection objective 10. The illumination system 66 has devices for selecting the illumination mode and can, for example, be switched between conventional illumination with a variable degree of coherence, annular field illumination and dipole or quadrupole illumination. Arranged after the illumination system is a device 68 for holding and manipulating a mask 70, such that the mask 70 lies in the object plane 12 of the projection objective 10 and can be moved in this plane for scanning operation. The device 68 correspondingly comprises the scanning drive.

Following after the object plane 12 is the projection objective 10 that projects an image of the mask 70 on a reduced scale onto a substrate or wafer 72 that is covered with a photoresist layer and is arranged in the image plane 14 of the projection objective 10. The substrate or the wafer 72 is held by a device 74 that comprises a scanner drive in order to move the wafer synchronously with the mask 70. All the systems are controlled by a control unit 74. The design of such systems is, like their mode of operation, known per se, and will therefore not be described in more detail here.

In the case of a method for producing semiconductor components and other finely structured subassemblies, the mask 70 is provided with a prescribed pattern (not illustrated). Via the illumination device 66, the mask 70 is illuminated with ultraviolet light of a predetermined wavelength from the laser 62. It is possible in this case to set various illumination modes that are sufficiently well known from the literature. The pattern of the mask 70 is then imaged via the projection objective 10 onto the substrate or the wafer 72 and into the image plane 14 of the projection objective 10. Various aperture openings can be set in this case.

FIG. 5 shows, once again, the projection objective 10 in FIG. 1, further measures for false light suppression being provided at the projection objective 10.

In order to suppress false light, the shields to be described below serve the purpose of masking out the respectively unused surface regions of the optical components to which these shields are assigned. The function of these shields is therefore different from the shield 24, that has already been described above, and whose function consists in preventing the propagation of light from the first objective part 16 into the third objective part 20 with the omission of the second objective part 18.

Figure 5:
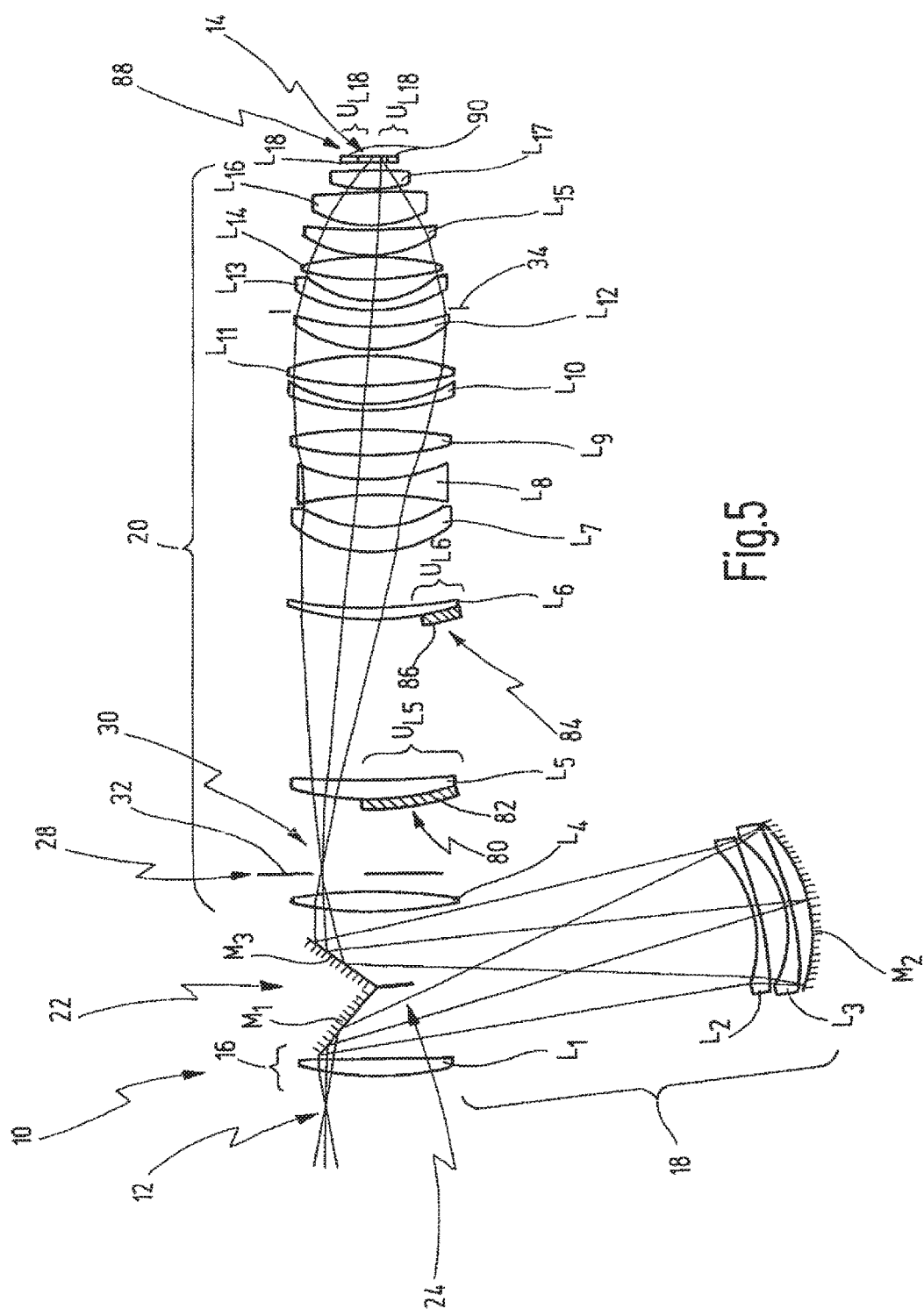
FIG. 5 shows the projection objective in FIG. 1 with a modification regarding the false light suppression.

According to FIG. 5, the lens $L_5$ has a surface region $U_{L5}$ that is not used by the imaging beam path for imaging the object plane 12 into the image plane 14. A shield 80 that masks out the unused surface region $U_{L5}$ of the lens $L_5$ in order to suppress false light is assigned to this unused surface region $U_{L5}$. The shield 80 is designed in the form of a coating 82 that is, in particular, absorbing for the wavelength of the light used for imaging. The absorbance of the shield 80 is in this case at least approximately 95%, preferably at least approximately 98%. The shield 80 in the form of the coating 82 can, however, also have alternatively or additionally reflecting properties.

The shield 80 further preferably has photocatalytic properties in order to decompose contaminants that are deposited on it, for example hydrocarbons. The gas space of the projection objective 10, which is located between the optical components, is thereby freed from these contaminants.

The lens $L_5$ is located in the vicinity of a field plane, specifically in the vicinity of the intermediate image 30. However, by contrast with the stray light stop 32, the shield 80 is assigned directly to the lens $L_5$ and even applied, in the form of the coating 82, directly to the lens $L_5$.

A further optical component that is suitable for being assigned a shield for suppressing false light is the lens $L_6$, which has a surface region $U_{L6}$ not used by the imaging beam path. The lens $L_6$ is correspondingly assigned a shield 84 that, in turn, is applied in the form of a coating 86 on the optically active surface of the lens $L_6$.

The last lens element $L_{18}$, which is directly adjacent to the image plane 14, has a surface region $U_{L18}$ not used by the imaging beam path, as is illustrated in FIG. 5. A further shield 88, which is formed from a coating 90, is correspondingly assigned on both sides to the last lens element $L_{18}$. In the case of the last lens element $L_{18}$, the coating 90 is formed annularly thereon such that the useful light can penetrate to the image plane 14 through the opening in the shield 88 in the form of the coating 90.

Figure 6:
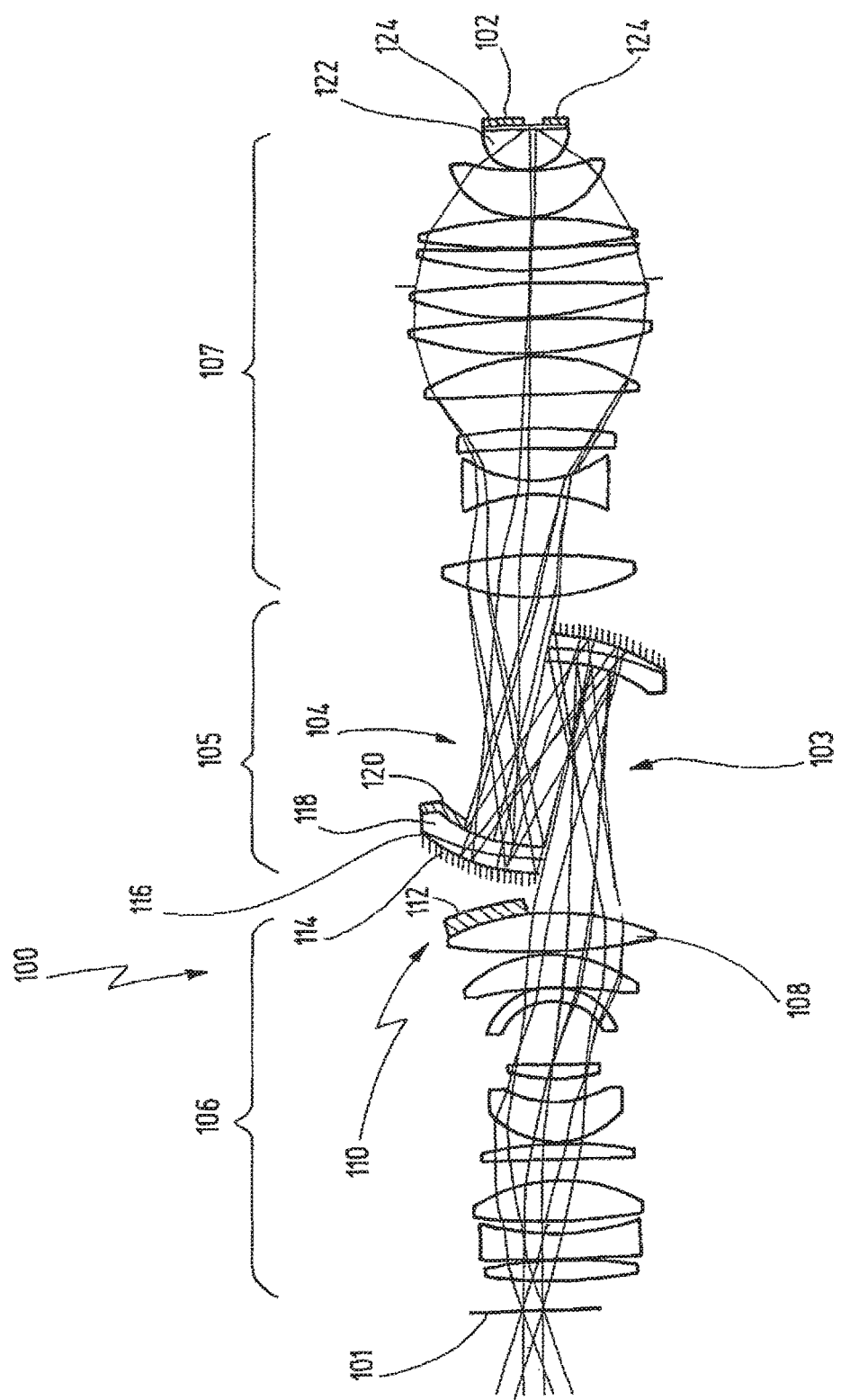
FIG. 6 shows a further exemplary embodiment of a projection objective with measures for false light suppression.

FIG. 6 shows a further catadioptric projection objective 100, in which, as described previously with reference to FIG. 5, measures are provided for false light suppression. The projection objective 100 is disclosed in US 2005/0190435 A1 to which reference may be made for a more accurate description of the design.

The projection objective 100 images an object plane 101 into an image plane 102. The projection objective 100 produces between the object plane 101 and the image plane 102 two intermediate images 103 and 104 that are located in a catadioptric objective part 105, upstream of which a refractive objective part 106 is located, and downstream of which a refractive objective part 107 is located.

Among the plurality of optical components of the projection objective 100, which comprises lenses and two mirrors, are ones whose at least one optically operative surface has a surface region that, during operation of the projection objective, is not used by the imaging beam path for imaging the object plane 101 into the image plane 102. These optical components are suitable for being directly assigned to a shield.

A lens 108 that is assigned a shield 110 in the form of a coating 112 belongs to these optical components. The coating 112 is applied to the optically operative surface, on the image side, of the lens 108, and preferably has, in turn, the properties of the coatings 82, 86 and 90, which have already been described with reference to FIG. 5.

A mirror 114 of the projection objective 100 likewise has a surface region not used by the light and which is provided with a shielding coating 116.

A lens 118 directly adjacent to the mirror 114 has an optically operative surface that has a surface region not used by the imaging beam path, and that is correspondingly provided with a shielding coating 120.

Finally, a last lens element 122 is likewise provided with a shielding coating 124.

The abovenamed optical components, which are assigned a shield as described, are all near the field, the lenses 108, 118 and the mirror 116 being arranged in the vicinity of the intermediate images 103 and 104, while the last lens element 122 is arranged in the vicinity of the image plane 102. Such near-field optical components are suitable, in particular, for being directly assigned a shield that, for the purpose of suppressing false light, masks out the respectively unused surface region of the optically operative surface of the respective optical component.

Figure 7:
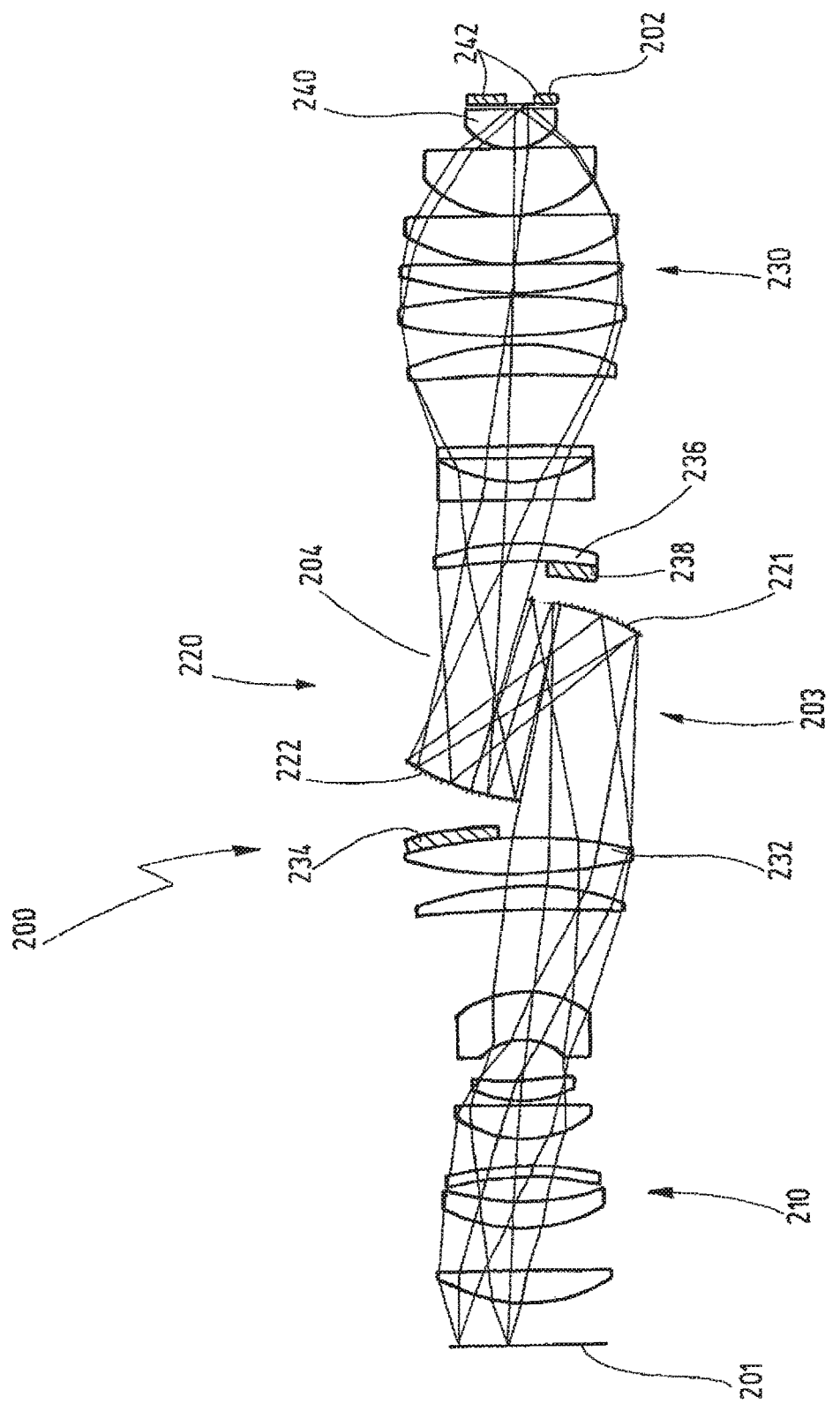
FIG. 7 shows a yet further exemplary embodiment of a projection objective with measures for false light suppression.

FIG. 7 shows a further projection objective 200, in the case of which measures comparable to FIGS. 5 and 6 are provided in order to suppress false light. The projection objective 200 is likewise disclosed in US 2005/0190435 A1.

The projection objective 200 has a plurality of optical components that image an object plane 201 into an image plane 202. The projection objective 200 has a refractive first objective part 210, a catoptric second objective part 220, that is formed from two mirrors 221 and 222, and a refractive third objective part 230.

An intermediate image 203 and an intermediate image 204 are produced in the catoptric objective part 220.

A last lens 232 of the first objective part 210 is provided with a shielding coating 234. A first lens 236 of the third objective part 230 is provided with a shielding coating 238. A last lens element 240 is provided with a shielding coating 242.

Here, as well, near-field optical components have been selected for the measures for suppressing false light.

Figure 8:
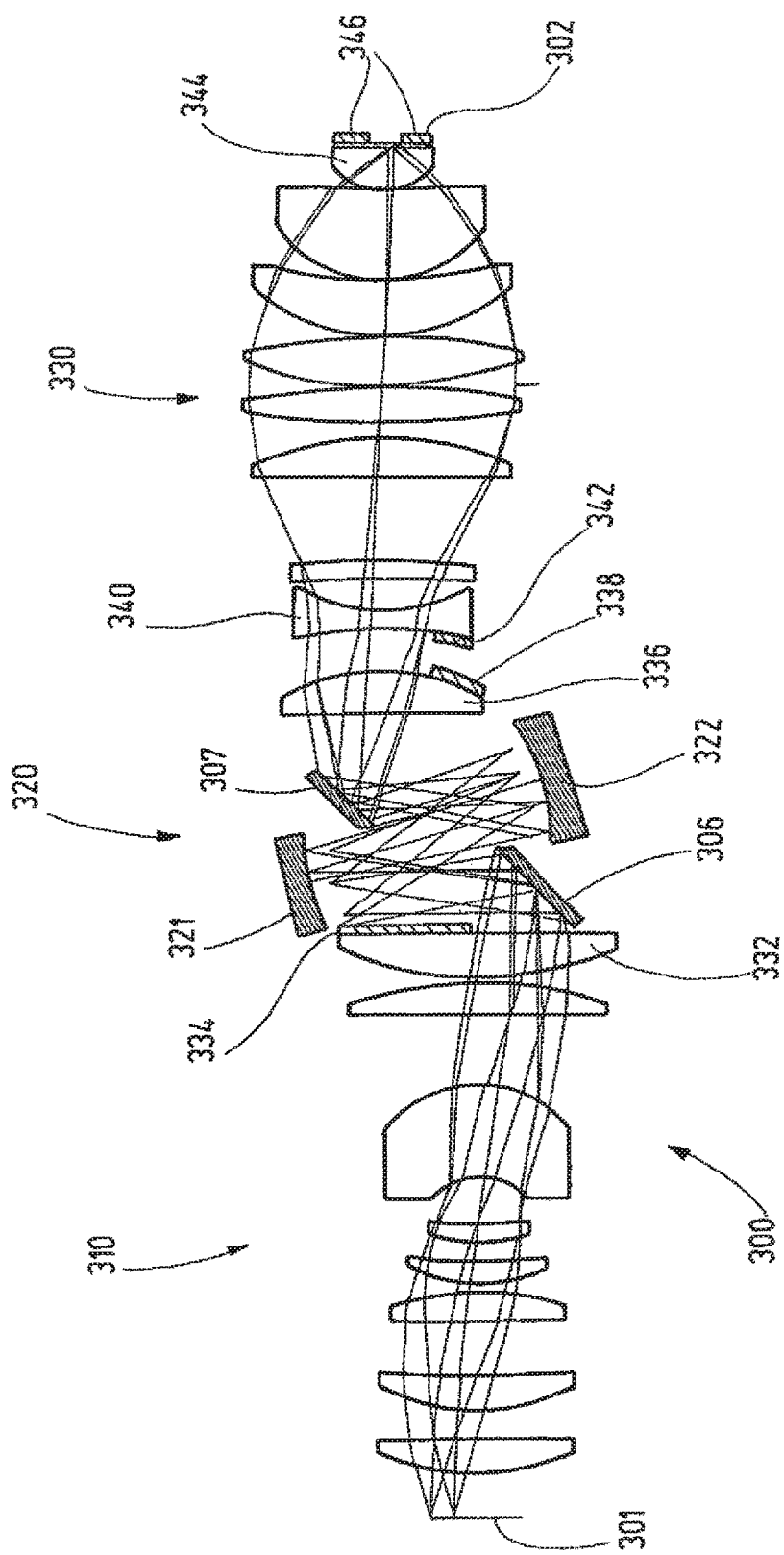
FIG. 8 shows a yet further exemplary embodiment of a projection objective with measures for false light suppression.

Finally, FIG. 8 shows a further projection objective 300, in the case of which measures are provided for suppressing false light. The projection objective 300 is likewise disclosed in US 2005/0190435 A1.

The projection objective 300 is a catadioptric projection objective that images an object plane 301 into an image plane 302. The projection objective 300 has a refractive first objective part 310, a catoptric second objective part 320 and a refractive third objective part 330.

The catoptric objective part 320 has four mirrors 306, 307 and 321, 322.

The projection objective 300 produces intermediate images in the catoptric objective part 320.

A lens 332 that is located in a position near the field has a surface region that is not used by the imaging beam path and is provided with a shielding coating 334. A further lens 336 is provided with a shielding coating 338 and a yet further lens 340 is provided with a shielding coating 342.

A last lens element 344 is likewise provided with a shielding coating 346.

Particularly when such projection objectives are designed as immersion objectives, the last lens elements, for example the lens element 344, are preferably provided with a coating that protects the last lens element 344 against degradation by the immersion liquid. In such a case, this protective coating can, in particular, also be designed with a shielding action, that is to say the protective layer then serves not only to protect the last lens element 344, but also to suppress false light.

Figure 9:
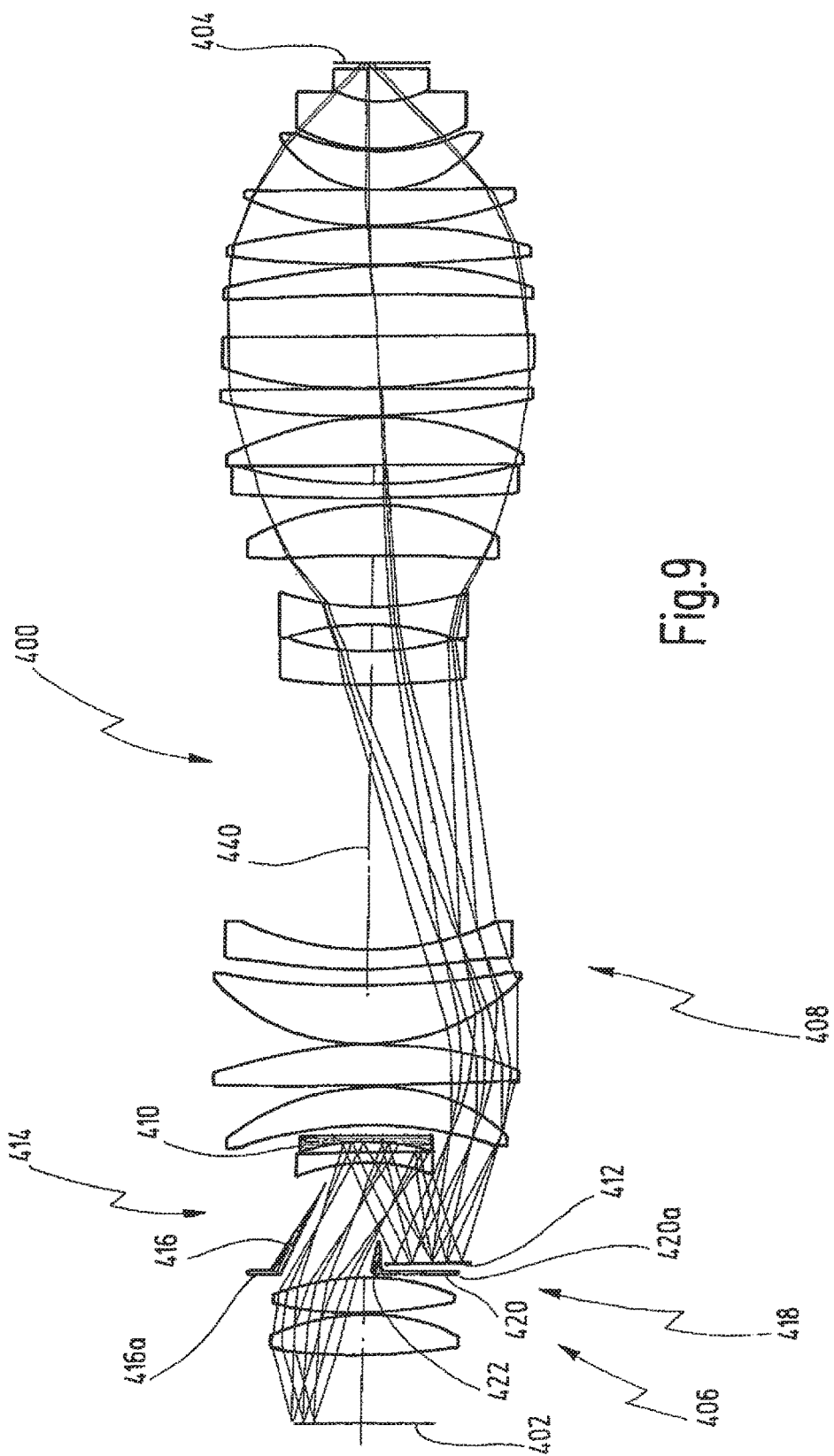
FIG. 9 shows a yet further exemplary embodiment of a projection objective with measures for false light suppression.
Figure 10:
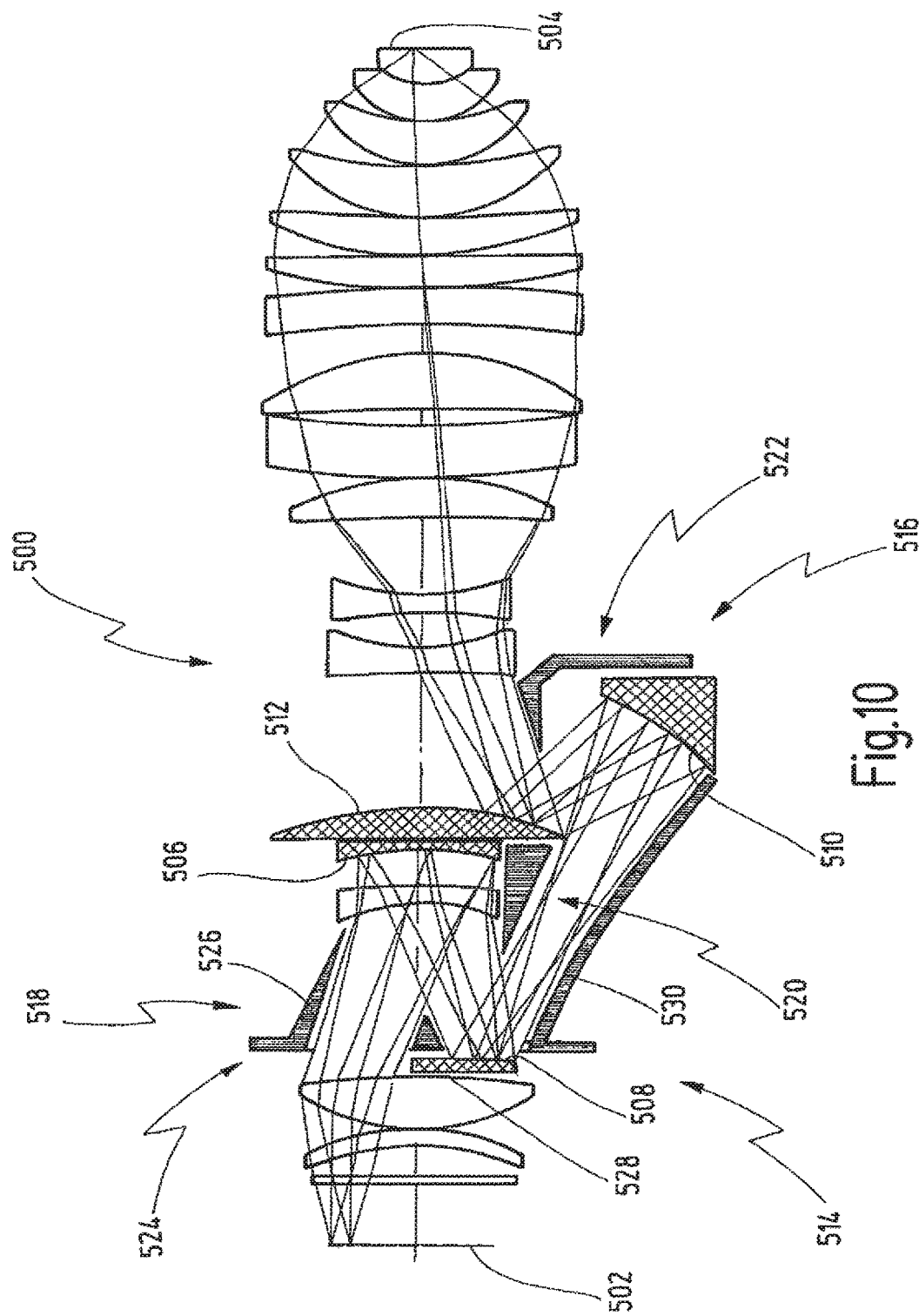
FIG. 10 shows a yet further exemplary embodiment of a projection objective with measures, for false light suppression.
Figure 11:
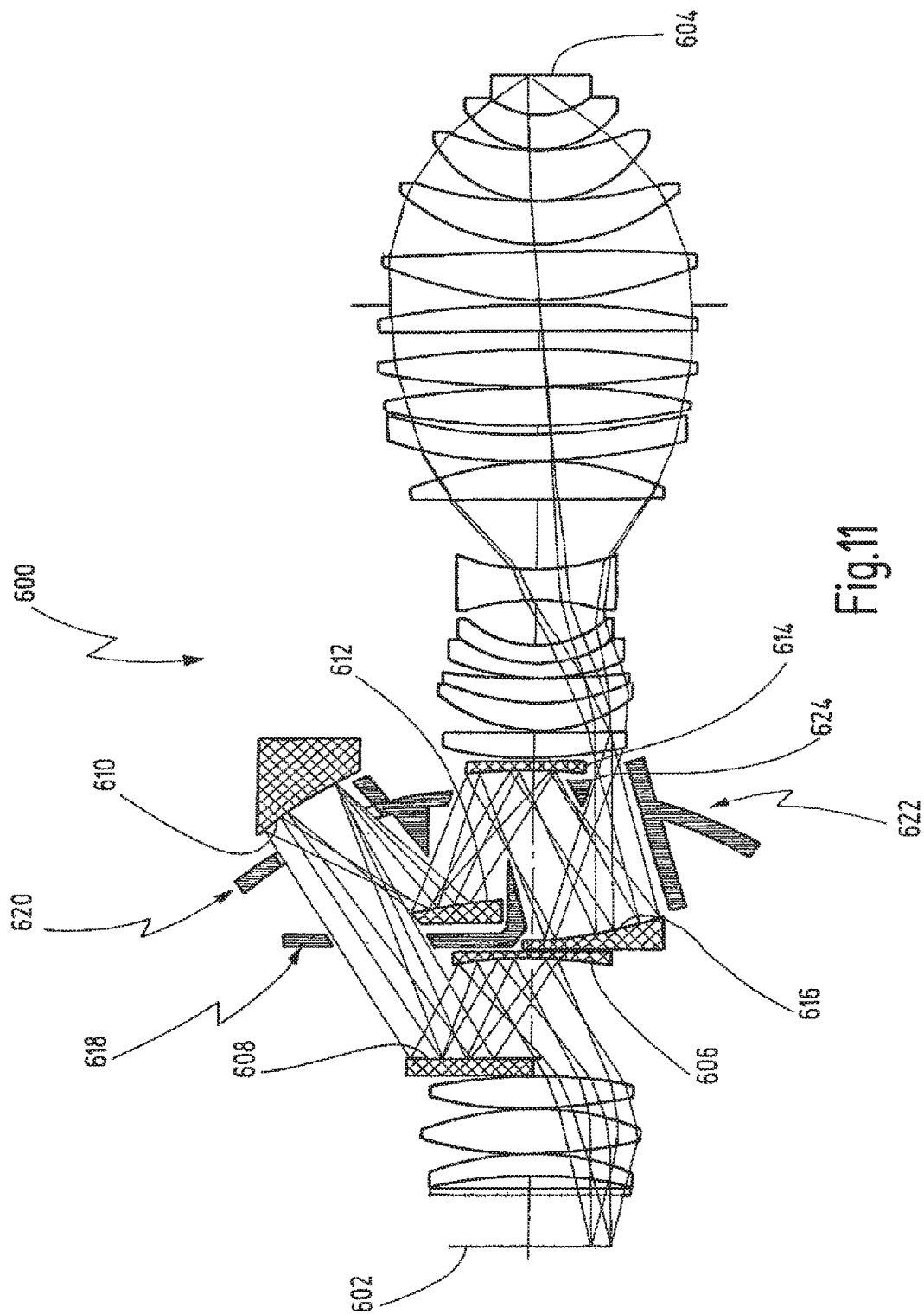
FIG. 11 shows a yet further exemplary embodiment of a projection objective with measures for false light suppression; and FIG. 12~

FIGS. 9 to 11 show projection objectives in the case of which measures are provided for false light suppression in accordance with the invention.

The measures for false light suppression that are taken in the case of the projection objectives that are to be described below are based on the following principle. In the case of a projection objective that has at least one mirror, an imaging beam path that can be used to image the pattern into the image plane can have in the region of the at least one mirror beam path segments that run obliquely relative to one another and overlap one another at least partially in an overlap region. The beam path segments are spaced apart from one another by a gap or free space outside the overlap region. A shield is arranged in this case in the gap in order to suppress false light. When such a projection objective has a number of such gaps or free spaces between the beam path segments or light bundles, it is preferably possible to introduce into each of these free spaces a shield, for example, in the form of one or more stray light stops, such that these free spaces or gaps are no longer available for the propagation of false light. False light can be effectively suppressed in this way.

FIG. 9 shows a projection objective 400, that has between an object plane 402 and an image plane 404 a first catadioptric objective part 406 and a second dioptric objective part 408. The projection objective 400 is described in document WO 2004/107011 A1, in FIG. 5 thereof.

The catadioptric objective part 406 has a first mirror 410 and a second mirror 412.

In order to suppress the propagation of false light, a first shield 414 is provided in the form of a stray light stop 416, and a second shield 418 is provided in the form of a stray light stop 420. The stray light stops 416 and 420, which can also be designed as sections of a stray light stop of a unipartite design, are, as emerges from FIG. 9, located in the vicinity of the mirrors 410 and 412, the stray light stop 416 extending into the region between the mirrors 410 and 412. The stray light stop 420 also has a section 422 that projects into the region between the mirrors 410 and 412. The stray light stops 416 and 420 have been installed such that the free space between the light bundles is filled between the two mirrors 410 and 412. Sections 416a and 420a, extending radially relative to the optical axis 440, of the stray light stops 416 and 420 prevent false light from passing from the object plane 402 along the first mirror 410 or along the second mirror 412 while omitting the latter, and prevent the lenses from imaging the second objective part 408 onto the image plane 404.

FIG. 10 shows a projection objective 500 that is likewise shown in the abovenamed document WO 2004/107011 A1, in FIG. 9 thereof, and is described in that document.

The projection objective 500 has between an object plane 502 and an image plane 504 four mirrors 506, 508, 510 and 512 that belong to two objective parts 514 and 516 of the projection objective 500 from which the projection objective 500 is constructed.

Shields 518, 520 and 522 are provided in the case of the projection objective 500 in order to suppress the propagation of false light. The shield 518 is a stray light stop 524 that has sections 526, 528 and 530 that can be designed as one subassembly, appropriate passages being provided in the stray light stop 424 for the imaging light provided for imaging. The shields 520 and 522 are likewise designed in the form of stray light stops that are arranged in the free space between light bundles of the imaging light.

Finally, FIG. 11 shows a projection objective 600, that is illustrated in the abovementioned document WO 2004/107011 A1 in FIG. 14 thereof, and is described in that document.

The projection objective has a total of six mirrors between an object plane 602 and an image plane 604, specifically in the direction of the light propagation: a first mirror 606, a second mirror 608, a third mirror 610, a fourth mirror 612, a fifth mirror 614 and a sixth mirror 616.

In order to prevent the propagation of false light in the projection objective 600, a number of shields are arranged in the form of stray light stops 618, 620, 622 and 624 in the region of the mirrors 606 to 616, and these in turn shield the free space between the light bundles to be used for imaging against the propagation of false light.

FIG. 12 shows another embodiment of a microlithography projection objective 700 for imaging a pattern arranged in an object plane 702 into an image plane 704.

The projection objective 700 comprises a plurality of optical components 705 to 733, wherein the optical components 713, 717 and 718 are mirrors and the remaining components of the optical component 705 to 733 are lenses.

The projection objective 700 further has a first pupil plane 736 in which a first aperture stop 738 is arranged. The aperture stop 738, which is adjustable in cross section defines the system or design aperture of the projection objective 700. A second pupil plane 740 is present between the optical components 707 and 708.

In the illustration of FIG. 12, two field points 742 and 744 of the object plane 702 are shown which illustrate the illuminated area of the pattern in the object plane 702. Starting from the field points 742 and 744, light rays propagate through the optical components 705 to 733 and reach the image plane 704 in an area 746. The light rays which reach the image plane 746 in the area 746 are used for imaging the pattern arranged in the object plane 702 into the object plane 704.

As shown in FIG. 12, there is a ray 748 starting from field point 742 in the object plane 702 which starts with an aperture which is larger than the aperture of the other rays, for example ray 749, which also start from the field point 742. Ray or rays 748 is/are called an over-aperture ray.

FIG. 12a shows the first four optical components 705 to 708 in an enlarged scale, showing the rays starting from field points 742 and 744 in more detail.

The over-aperture ray 748 which actually is a small bundle of rays, propagates through the projection objective 700 partially separated from the rays used for imaging, and partially not separated from the rays used for imaging, the latter reaching the image plane 704 in the area 746. The over-aperture rays, instead, reach the image plane 704 in an area 750. The over-aperture rays 748 disturb the imaging, in particular by producing a non-uniform field in the image plane 704.

In order to prevent the over-aperture rays 748 from reaching the image plane 704, at least a second aperture stop in addition to the system aperture stop 738 is provided in the projection objective 700 as described in the following.

The second aperture stop is preferably arranged at a position in the projection objective 700, where the over-aperture rays 748 are separated from the "ordinary" rays which are useful for imaging. Such a position may be for example the space between the optical component 706 and the optical component 707 (see. arrow 752 in FIG. 12A) and/or the location between the optical component 707 and 708 (see arrow 754 in FIG. 12A). In the latter case, because the space between the optical components 707 and 708 is small, the second aperture stop can be formed by a coating 756 on the optical component 707 or 708 which is non-transmissive to the light used for the exposure operation.

The coating can be formed by a blacking of the respective portion of the surface of the optical component 707, for example.

At the position shown by arrow 752, the at least one second aperture stop can be formed by a plate having suited shielding properties for shielding or masking out the over-aperture rays 748.

Another position which is very suitable for arranging at least a second aperture stop for masking out the over-aperture rays 748 is in an area 758 of the projection objective 700, where the over-aperture rays 748 are significantly separated from rays 760, which are the rays used for imaging and having the largest height with respect to the optical axis. It can be seen in FIG. 12 that the rays 748 are strongly refracted or aberrated when emerging from component 724, far more than the "ordinary" rays.

For example, a second or further aperture stop 762 can be arranged between the optical component 725 and the optical component 726, and/or between the optical components 726 and 727, etc.

The position of the second or further aperture stop 762 is preferably chosen such that the distance L of the aperture stop 762 from the system aperture 738 is such that $0.5D<L<2D$, wherein D is the maximum diameter of the optical components in this area.

The at least one second aperture stop, when for example arranged at the position shown by arrow 752 or the aperture stop 762 preferably are fixed aperture stops, and the aperture stop 738 defining the system aperture is adjustable with respect to its effective cross-section.

The projection objective 700 has at least one intermediate image plane between the first pupil plane 738 and the second pupil plane 740. Further, at least one of the optical components 705 to 733 of the projection objective 700 may have an aspherical optically operative surface. In particular in projection objectives having components with aspherically operative surfaces, over-aperture rays like over-aperture rays 748 are aberrated to a higher degree as in projection objectives without aspherical components. Thus, the provision of at least a second aperture stop in such a projection objective having aspherical components is in particular advantageous.

It is to be understood that at least a second aperture stop as described with reference to FIG. 12 can also be provided in any of the projection objectives shown in FIGS. 1 to 11, if appropriate. Vice versa, the shields for shielding false light which have been described with respect to FIGS. 1 to 11, can be provided within projection objective 700, too.

The invention claimed is:

1. A projection objective, comprising:
  a plurality of optical components configured to image a pattern in an object plane along an imaging beam path through the projection objective into an image plane, each optical component comprising an optically operative surface; and
  a first shield having an adjustable position,
  wherein:
    the plurality of optical components comprises a first optical component comprising a first optically operative surface configured so that, during the operation of the projection objective, the first optically operative surface comprises a first surface region not used by the imaging beam path to image the pattern into the image plane;
    the first shield is configured to mask out the first surface region to suppress false light; and
    the projection objective is a microlithography projection objective, and
  wherein one of the following holds:
    i) the first shield is not located in a pupil plane of the projection objective or a field plane of the projection objective;
    ii) the projection objective has a pupil plane and an intermediate image plane, and the first shield is between the pupil plane and the intermediate plane; and
    iii) the projection objective has a first pupil plane, a second pupil plane and an intermediate image plane, the intermediate image plane is between the first and second pupil planes, the second pupil plane is between the intermediate image plane and the image plane, and the first shield is between the intermediate image plane and the second pupil plane.

2. The projection objective of claim 1, wherein the first shield comprises a plate in an immediate vicinity of the first optically operative surface.

3. The projection objective of claim 1, wherein the first shield comprises an aperture in an immediate vicinity of the first optically operative surface, and the aperture has an opening adapted to a cross-sectional shape of the imaging beam path at the aperture.

4. The projection objective of claim 3, wherein the opening in the aperture is substantially rectangular.

5. The projection objective of claim 1, wherein the first shield comprises a shielding coating on the first surface region.

6. The projection objective of claim 1, wherein the first shield is reflective for a wavelength of the light used to image the pattern during operation of the projection objective.

7. The projection objective of claim 1, wherein the first shield is absorbing for a wavelength of the light used to image the pattern during operation of the projection objective.

8. The projection objective of claim 1, wherein the first optically operative surface is a near-field surface.

9. The projection objective of claim 1, wherein the first optical component comprises a mirror.

10. The projection objective of claim 1, wherein the first optical component comprises a lens.

11. The projection objective of claim 1, further comprising a second shield, wherein:
  the plurality of optical components comprises a second optical component comprising a second optically operative surface configured so that, during operation of the projection objective, a second surface region of the second optically operative surface is not used by the imaging beam path for imaging the pattern into the image plane; and
  the second shield is configured to mask out the second surface.

12. The projection objective of claim 1, further comprising a second shield configured to shield over-aperture light from the object plane.

13. The projection objective of claim 1, wherein the first shield is not located in a pupil plane of the projection objective or a field plane of the projection objective.

14. The projection objective of claim 1, wherein the projection objective has a pupil plane and an intermediate image plane, and the first shield is between the pupil plane and the intermediate plane.

15. The projection objective of claim 14, wherein the pupil plane is between the intermediate image plane and the image plane.

16. The projection objective of claim 1, wherein:
the projection objective has a first pupil plane, a second pupil plane and an intermediate image plane;
the intermediate image plane is between the first and second pupil planes;
the second pupil plane is between the intermediate image plane and the image plane; and
the first shield is between the intermediate image plane and the second pupil plane.

17. A projection objective, comprising:
a plurality of optical components configured to image a pattern in an object plane along an imaging beam path through the projection objective into an image plane, each optical component comprising an optically operative surface; and
a first shield having a variable active cross-section;
wherein:
the plurality of optical components comprises a first optical component comprising a first optically operative surface configured so that, during the operation of the projection objective, the first optically operative surface comprises a first surface region not used by the imaging beam path to image the pattern into the image plane;
the first shield is configured to mask out the first surface region to suppress false light; and
the projection objective is a microlithography projection objective, and
wherein one of the following holds:
i) the first shield is not located in a pupil plane of the projection objective or a field plane of the projection objective;
ii) the projection objective has a pupil plane and an intermediate image plane, and the first shield is between the pupil plane and the intermediate plane; and
iii) the projection objective has a first pupil plane, a second pupil plane and an intermediate image plane, the intermediate image plane is between the first and second pupil planes, the second pupil plane is between the intermediate image plane and the image plane, and the first shield is between the intermediate image plane and the second pupil plane.

18. The projection objective of claim 17, further comprising an aperture of the projection objective configured to limit the imaging beam path, wherein the projection objective is configured so that the active cross-section of the first shield and the aperture are set in common.

19. The projection objective of claim 17, wherein the projection objective is configured so that setting the active cross-section of the first shield is a function of a size of the image field.

20. The projection objective of claim 17, wherein the projection objective is configured so that setting the active cross-section of the first shield is a function of an illumination setting of the projection objective.

21. The projection objective of claim 17, wherein the first shield comprises a plate in an immediate vicinity of the first optically operative surface.

22. The projection objective of claim 17, wherein the first shield comprises an aperture in an immediate vicinity of the first optically operative surface, and the aperture has an opening that is adapted to a cross-sectional shape of the imaging beam path at the aperture.

23. The projection objective of claim 22, wherein the opening is substantially rectangular.

24. A projection objective, comprising:
a plurality of optical components configured to image a pattern in an object plane along an imaging beam path through the projection objective into an image plane; and
a first shield,
wherein:
the plurality of optical components comprises a first optical component comprising a first optically operative surface configured so that, during the operation of the projection objective, the first optically operative surface comprises a first surface region not used by the imaging beam path to image the pattern into the image plane;
the first shield has at least one property selected from the group consisting of an adjustable position and a variable active cross-section;
the first shield is configured to mask out the first surface region to suppress false light; and
the projection objective is a microlithography projection objective, and
wherein one of the following holds:
i) the first shield is not located in a pupil plane of the projection objective or a field plane of the projection objective;
ii) the projection objective has a pupil plane and an intermediate image plane, and the first shield is between the pupil plane and the intermediate plane; and
iii) the projection objective has a first pupil plane, a second pupil plane and an intermediate image plane, the intermediate image plane is between the first and second pupil planes, the second pupil plane is between the intermediate image plane and the image plane, and the first shield is between the intermediate image plane and the second pupil plane.

* * * * *

UNITED STATES PATENT AND TRADEMARK OFFICE
CERTIFICATE OF CORRECTION

PATENT NO. : 10,281,824 B2
APPLICATION NO. : 15/414005
DATED : May 7, 2019
INVENTOR(S) : Heiko Feldmann et al.

It is certified that error appears in the above-identified patent and that said Letters Patent is hereby corrected as shown below:

In the Specification

Column 2, Line 46: Delete "surfaces." and insert -- surfaces, --, therefor.

Column 3, Line 49: Delete "lense" and insert -- lens --, therefor.

Column 7, Line 9 (approx.): Delete "unction" and insert -- function --, therefor.

Column 10, Line 11: Delete "measures," and insert -- measures --, therefor.

Column 10, Lines 11-12: Delete "suppression; and" and insert -- suppression; --, therefor.

Signed and Sealed this
Sixth Day of August, 2019

Andrei Iancu
*Director of the United States Patent and Trademark Office*